(12) United States Patent
Kwasnick et al.

(10) Patent No.: US 6,680,216 B2
(45) Date of Patent: Jan. 20, 2004

(54) METHOD OF MAKING IMAGER STRUCTURE

(75) Inventors: Robert Forrest Kwasnick, Palo Alto, CA (US); Jianqiang Liu, Clifton Park, NY (US); George Edward Possin, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 22 days.

(21) Appl. No.: 10/187,241

(22) Filed: Jul. 2, 2002

(65) Prior Publication Data

US 2002/0195601 A1 Dec. 26, 2002

Related U.S. Application Data

(62) Division of application No. 09/522,231, filed on Mar. 9, 2000, now Pat. No. 6,465,824.

(51) Int. Cl.[7] .................................................. H01L 21/00
(52) U.S. Cl. ........................... 438/57; 438/73; 438/149; 438/584; 438/725
(58) Field of Search ............................ 438/48, 57, 64, 438/66, 69, 72, 73, 149, 150, 725, 584

(56) References Cited

U.S. PATENT DOCUMENTS

| | | | | |
|---|---|---|---|---|
| 5,585,280 A | * | 12/1996 | Kawsnick et al. | |
| 5,714,790 A | * | 2/1998 | Sakamoto | |
| 5,777,355 A | * | 7/1998 | Possin et al. | |
| 6,232,626 B1 | * | 5/2001 | Rhodes | |
| 6,488,555 B2 | * | 12/2002 | Pichler et al. | |
| 6,605,495 B1 | * | 8/2003 | Kuo | |
| 6,605,823 B1 | * | 8/2003 | Pichler et al. | |

* cited by examiner

Primary Examiner—Savitri Mulpuri
(74) Attorney, Agent, or Firm—Jean K. Testa; Patrick K. Patnode

(57) ABSTRACT

In an imager having an array of light-sensitive elements and employing striped common electrodes, exposed edges of preimidized polyimide layers above the light-sensitive imaging elements are sealed with the material of the common electrode (e.g., indium tin oxide). Similarly, exposed preimidized polyimide edges in electrical contacts for the array and bridge members electrically coupling adjacent light-sensitive imaging elements are also sealed with the material of the common electrode.

11 Claims, 7 Drawing Sheets

METHOD OF MAKING IMAGER STRUCTURE

This application is a division of application Ser. No. 09/522,231 filed Mar. 9, 2000, U.S. Pat. No. 6,465,824 which is hereby incorporated by reference in its entirety.

The United States Government may have certain rights in this invention pursuant to contract number MD972-94-0028 awarded by the Advanced Research Project Agency (ARPA).

BACKGROUND OF THE INVENTION

This invention generally relates to light-sensitive imaging arrays. More particularly, the present invention relates to sealing of exposed edges of organic dielectric layers to prevent undercutting of the organic dielectric layers from adversely affecting imager performance and reliability.

Photosensitive element arrays for converting incident radiant energy into an electrical signal are commonly used in imaging applications, for example, in x-ray imagers and facsimile device arrays. Hydrogenated amorphous silicon (a-Si) and alloys of a-Si are commonly used in the fabrication of photosensitive elements for such arrays due to the advantageous characteristics of a-Si and the relative ease of fabrication. In particular, photosensitive elements, such as photodiodes, can be formed from such materials in conjunction with necessary control or switching elements, such as thin film transistors (TFTs), in relatively large arrays.

X-ray imagers, for example, are formed on a substantially flat substrate, typically glass. The imager includes an array of pixels with light-sensitive imaging elements, typically photodiodes, each of which has an associated switching element, such as a TFT or one or more additional addressing diodes. In conjunction with a scintillator, x-rays are transformed into visible light for imaging with the photosensitive elements. The photosensitive elements, typically photodiodes, are connected at one surface to a switching device, typically a thin-film transistor, and at the other surface to a common electrode which contacts all the photodiodes in parallel. The array is addressed by a plurality of row and column address lines having contact pads located along the sides of the array. In operation, the voltage on the row lines, and hence the TFTs, are switched on in turn, allowing the charge on that scanned line's photodiodes to be read out via the column address lines, which are connected to external amplifiers. The row address lines are commonly referred to as "scan lines" and the column address lines are referred to as "data lines." The address lines are electrically contiguous with contact fingers which extend from the active region toward the edges of the substrate, where they are in turn electrically connected to contact pads. Connection to external scan line drive and data line read out circuitry is made via the contact pads.

The common electrode, which is disposed over the top of the photodiode array provides electrical contact to the photodiode array. The photodiode array is typically overlaid with a first layer of inorganic and a second layer of organic polymer dielectric, as disclosed in U.S. Pat. No. 5,233,181, issued on Aug. 3, 1993 to Kwansnick (sic) et al. Contact vias are formed over the photodiodes in each dielectric layer to allow electrical contact to the photodiode tops by the common electrode.

Patterning of the common electrode comprises deposition, photolithography and photoresist strip, as is well known in the art. For light imagers comprising amorphous silicon, it is observed that the vias, necessary for electrical connection between the contact pads and the contact fingers, may be damaged if the photoresist is removed by a wet strip process, degrading the imager. Therefore, dry strip of the common electrode photoresist is generally used, for example, by ashing with a plasma containing $O_2$. However, the dry strip also etches the underlying organic polymer, causing undercut of its edges under those of the common electrode. A barrier layer is typically disposed on the imager after common electrode formation, for example, see U.S. Pat. No. 5,401,668, issued Mar. 28, 1999 to Kwasnick et al., and this common electrode overhang results in poor step coverage of the barrier layer, causing degraded environmental protection and possible photodiode leakage. Thus, a need exists to address the undercutting problem.

It is desirable that the imager structure be robust both for withstanding the fabrication process and good performance in operation. As higher performance is required of imagers (e.g., noise, resolution, etc.), the necessity arises of greater patterning of the imager structure to provide the desired performance in operation and ability to withstand the rigors of fabrication and usage.

SUMMARY OF THE INVENTION

In one example of the present invention, a structure and a method of forming the structure for an imager is presented. The structure comprises an organic dielectric layer, and a common electrode, comprising a light-transmissive conductive layer, the common electrode covering the organic dielectric layer and extending beyond an exposed edge of the organic dielectric layer along a "striped" segment of the common electrode.

DETAILED DESCRIPTION OF THE INVENTION

Figure 1:
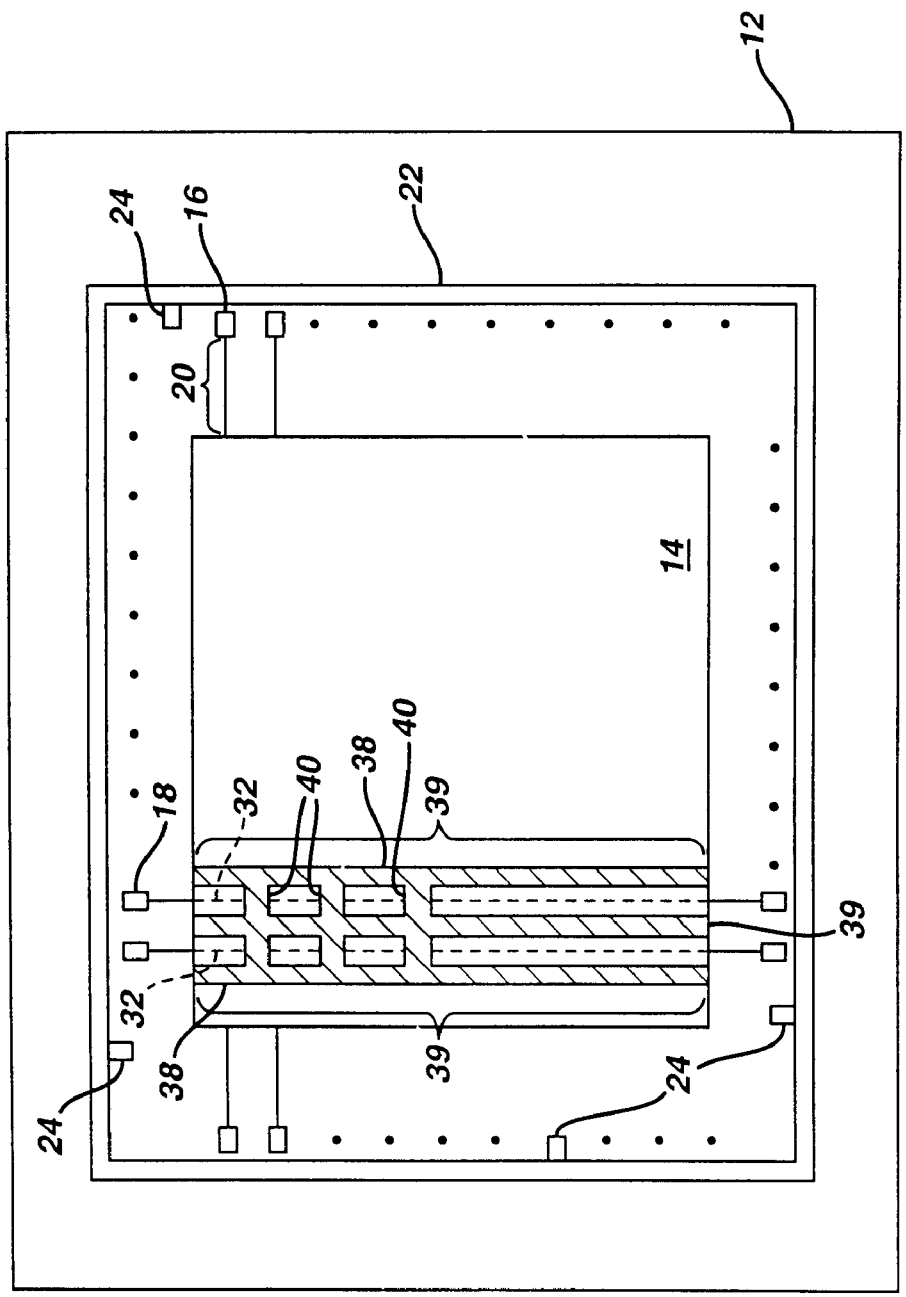
FIG. 1 is a plan view of an imager in accordance with the present invention.

FIG. 1 is a plan view of an exemplary imager 10 in accordance with the present invention. The imager 10 is typically formed on a substantially flat substrate 12, typically glass. The imager 10 includes an array 14 of light-sensitive imaging elements, preferably photodiodes, arranged in a matrix, each imaging element having associated therewith a switching element, preferably a thin-film transistor (TFT). Both devices (photodiode and TFT) preferably comprise amorphous silicon (a-Si). This light sensitive region of the array is typically referred to as the active region of the array. The array 14 is addressed around its perimeter by a plurality of row and column address lines having contact pads 16 and 18, respectively, which are located along the sides of array 14 as indicated by the dot representations of FIG. 1.

In operation, the voltage on the row lines, and hence the TFTs, are switched on in turn, allowing the charge on that scanned line's photodiodes to be read out via the column address lines. The row address lines are commonly called the scan lines and the column address lines the data lines. A data line 32 (a few representative examples of which are illustrated in FIG. 1) typically extends between each of corresponding set of contact pads 18 in the array, which data lines are used for readout of charge accumulated on the photodiode array during imaging operations.

The address lines are disposed in the active region of the pixel array 14, with contact finger 20 extending from the active region towards the edge of the substrate. The contact finger 20 electrically connects to contact pads, such as row contact pads 16 and column contact pads 18, which, in turn, can be electrically connected to external devices. As more fully discussed in U.S. Pat. No. 5,389,775 issued Feb. 14, 1995 of Kwasnick et al., the contact pads include contact pads connected to common electrodes of the array.

Outside the contact pads, such as contact pad 16, a guard ring 22 is typically disposed around the perimeter of the pixel array. Guard ring 22 is typically maintained at ground potential during operation and serves the purpose of protecting the array from electrostatic discharge during the formation of the imager, and during connection of the imager to external circuitry, and acts as a ground potential for the imager 10. The guard ring 22 has one or more guard contact pads 24 spaced apart from each other around the inner side of the perimeter of the guard ring 22 as shown in FIG. 1.

A common electrode 38 (a small representative portion of which is illustrated in FIG. 1) is disposed over the array to provide a common contact to the tops of each of the diodes in the imager array. Electrical capacitance between the data lines 32 and the common electrode 38 can contribute to electrical noise in the read out circuitry. For low signal applications, such as fluoroscopy in medical procedures, and for large imagers with data lines longer than about 20 cm, the noise is of a magnitude that imager performance is degraded. Thus, the common electrode typically is removed from the region overlaying the data lines 32, reducing the capacitance and thereby improving imager performance, resulting in a so-called "striped" common electrode. The common electrode thus has a plurality of striped segments 39 extending across the imager substantially parallel to, but not overlying, the data lines 32. The respective striped segments 39 are coupled by a plurality of bridge members 40 (disposed so as to be "cross-striped" in FIG. 1) that bridge over the data line between striped segments.

Figure 2:
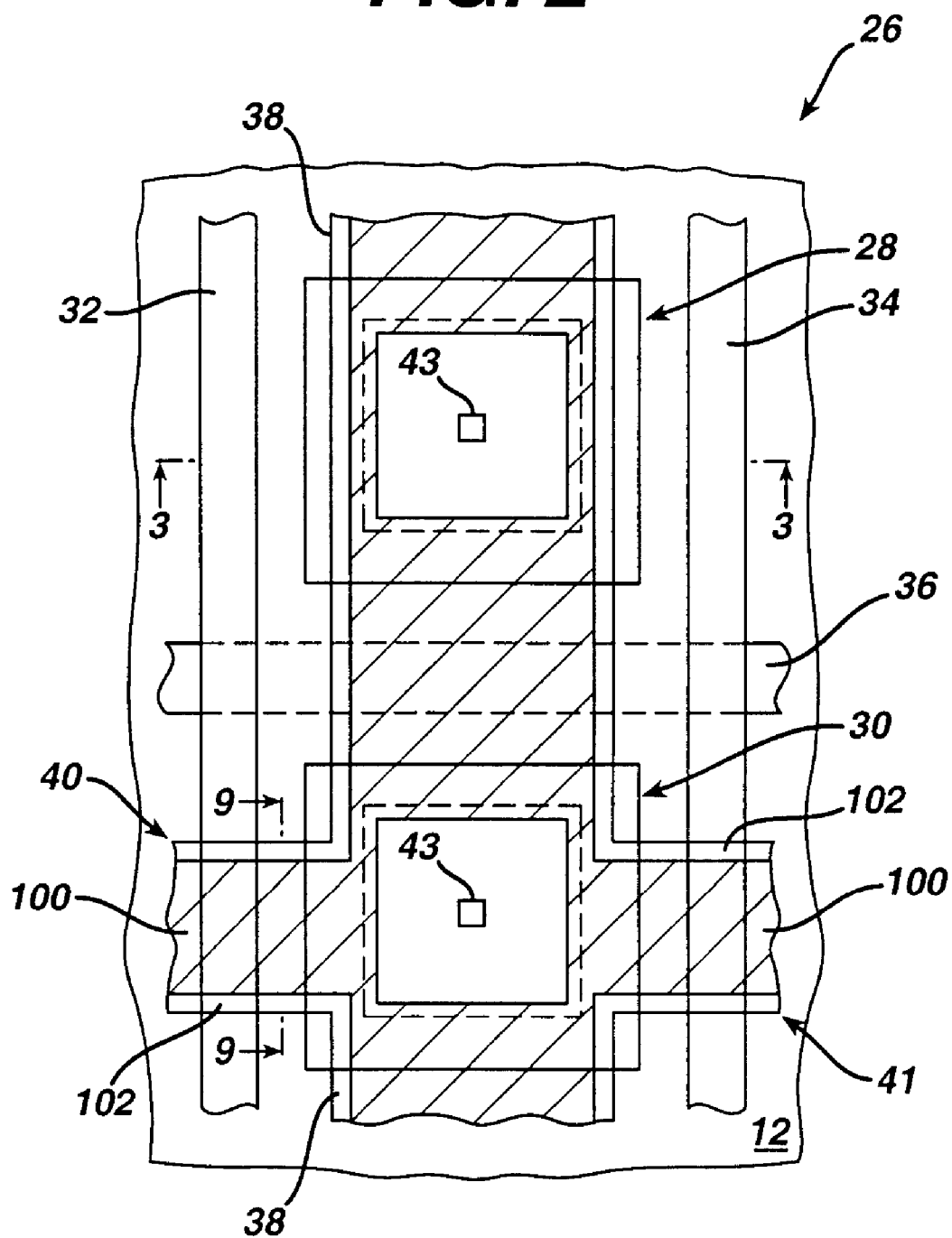
FIG. 2 is an exploded view of a segment of the imaging array in the imager of FIG. 1.

FIG. 2 is a plan view of a portion 26 of the light-sensitive imaging array 14 of FIG. 1, including glass substrate 12, adjacent light-sensitive imaging elements 28 and 30 and data lines 32 and 34. Preferably, elements 28 and 30 are photodiodes. Also shown in phantom is a scan line 36. A striped common electrode 38 is coupled to all the light-sensitive imaging elements in the array, as well as to bridge members (discussed below), and acts as a low resistance electrical return path to the photodiodes from external circuitry. The striped common electrode is electrically coupled to the respective photodiodes with a respective via 43 formed through underlying dielectric layers to enable the common electrode material to come into electrical contact with the semiconductor material of the photodiode body.

As noted above, the striped common electrode 38 generally runs parallel to, but does not cover, the data lines. Preferably, the common electrode is situated laterally a distance of at least about 3 microns from the data lines. Bridge members 40 and 41 electrically couple photodiode 30 to adjacent photodiodes (not shown) to the left and right of photodiode 30. Although bridge members 40 and 41 electrically couple three adjacent photodiodes, it will be understood that bridge member groups of more or less immediately adjacent electronically coupled photodiodes could be created. Although there could be bridge members between all adjacent photodiodes, they are preferably periodically dispersed in the array, for example, every other photodiode group, or most preferably about ten to about twenty photodiodes between groups in a given row in order to reduce data line capacitance.

The bridge members promote electrical re-equilibration in the array after an image is taken. Since the array includes many photodiodes, each photodiode will have different voltages during imaging, and current may tend to flow in the direction of the scan lines as well as the data lines. The bridge members help current to flow in the direction of the scan lines.

Since the common electrodes are striped, breaks in the common electrode or electrical isolation of a diode for repair will sever the connection. The bridge members solve this problem by providing an alternate connection path should a common electrode stripe develop a break for any reason. Bridge members generally are described in detail in U.S. Pat. No. 5,777,355, entitled "Radiation Imager with Discontinuous Dielectric" issued to Possin et al. on Jul. 7, 1998.

As used herein, "striped segment" of the common electrode refers to those portions of the common electrode extending both vertically (segment 39) and horizontally (cross bridge structure 40) as illustrated in FIG. 1, and reference to edges of dielectric material along the striped segments of the common electrode relate to those edges where the common electrode material has been terminated (that is, the conductive material has been removed) so as to not overlie data lines 32, and does not refer to vias 40 that are formed to enable electrical contact between the photodiode and the common electrode. Typically in vias, the common electrode material is not terminated, but forms a covering over the walls of the via and the surface of the semiconductor material of the photodiode body that was exposed by formation of the via.

Figure 3:
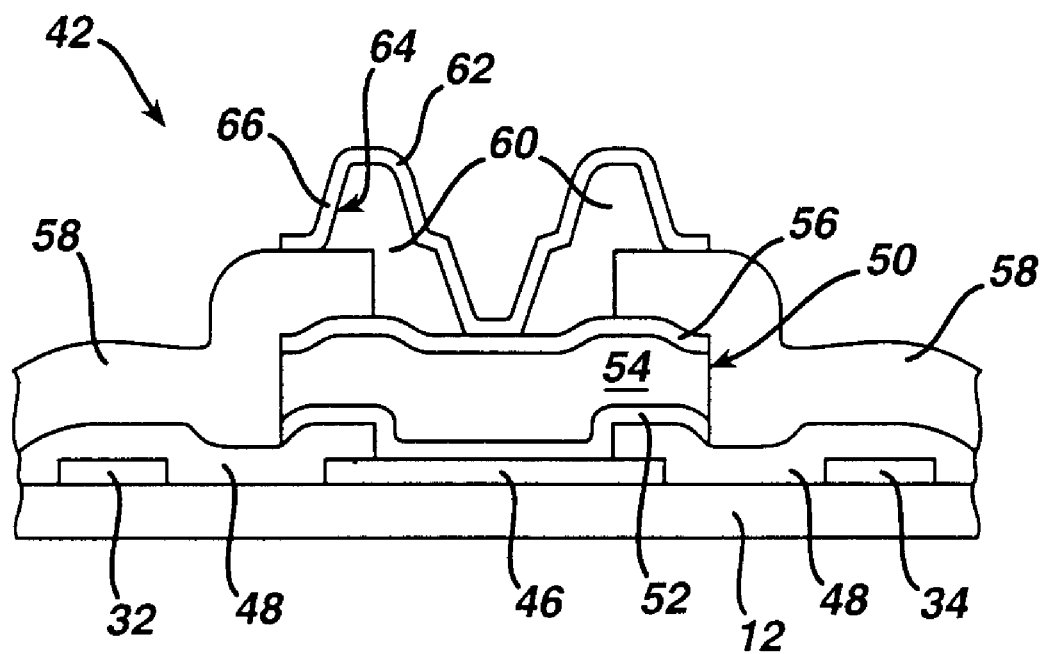
FIG. 3 is a cross-sectional view taken along lines 3—3 of a portion of the array segment of FIG. 2.

FIG. 3 is a cross-sectional view of a section 42 of portion 26 of FIG. 2 taken along line 3—3 through photodiode 28. Section 42 includes data lines 32 and 34 on substrate 12, as well as diode bottom contact pad 46. The data lines typically comprise, for example, molybdenum, aluminum or a tiered combination thereof. Covering the data lines and edges of the diode bottom contact pad is a layer 48 of a passivation dielectric, such as, for example, silicon oxide deposited, for example, by plasma-enhanced vapor deposition. Over the bottom contact pad is photodiode 50. Photodiode 50 includes, for example, a bottom layer 52 of N+ silicon doped with, for example, phosphorous. Above bottom layer 52 is, for example, a layer 54 of substantially intrinsic silicon over which is a layer 56 of P+ doped silicon using, e.g., boron. Covering the edges of photodiode 50 is a layer 58 of a passivation dielectric, such as, for example, silicon nitride or silicon oxide. Alternatively, the dual-layer dielectric discussed in U.S. Pat. No. 5,233,181, issued on Aug. 3, 1999 to Kwansnick (sic) et al., is used. Covering the inner edges of layer 58 and contacting top layer 56 of photodiode 50 is a layer 60 of a second organic dielectric, preferably preimidized polyimide (available from, for example, Arch Chemical, Inc.). Finally, covering the polyimide layer is a light-transmissive conductive layer 62 contacting photodiode 50 (here, contacting the top of the photodiode), and serving as the striped common electrode 38. Preferably, layer 62 (that forms common electrode 38) is a light-transmissive conductive oxide, and most preferably, indium tin oxide. The preference for transparency is to allow for the transmission of light into the photodiode. As used herein, the term "light-transmissive" means allowing at least about 10% of the incident light to pass through.

The use of polyimide for layer 60 serves three purposes. The first purpose is to improve step coverage of subsequent fabrication layers. Polyimide is disposed onto the substrate as a viscous liquid and so forms a conformal coating over layer 58. When patterned by conventional photolithographic methods, it forms a gradual slope for the common electrode material (i.e., the light-transmissive conductive material) because it etches in $O_2$ plasma at about the same rate as that of photoresist, which is naturally sloped by a postbake done as part of standard photolithography. For example, a moisture barrier layer formed over light-transmissive conductive layer 62 shows improved step coverage by using polyimide for organic dielectric layer 60. The second purpose is to help prevent electrical shorts, as polyimide does not tend to form to have pin holes, which are more commonly seen in some inorganic dielectric layers (e.g., silicon oxide). The third purpose for use of the polyimide layer is the reduction of electrical capacitance between the common electrode and data lines. As noted above, patterning the common electrode 38 into striped segments 39, with connecting bridges 40, is also used to reduce undesirable parasitic capacitance between the common electrode and the data lines.

In each of FIGS. 2 and 3, the switching element in each pixel, for example, a thin film transistor, is not shown to simplify the figure for ease of understanding the invention.

As applied to array 14, and in particular to representative section 42 (FIG. 3), in one embodiment the present invention includes covering at least a portion of the exposed edges the organic dielectric (here, polyimide) layers 60 and 100 (layer 100 described hereafter) along the striped segments of the common electrode with the light-transmissive conductive material (here, indium tin oxide), as explained more fully below. For example, polyimide edge 64 is covered with portion 66 of common electrode material layer 62. Covering exposed edges (e.g., the non-horizontal surfaces of the organic dielectric where it becomes discontinuous) serves to seal these edges (that is, coat them) so as to protect the edge, that is reduce the surface area of the organic dielectric that may be subject to undercutting or other attack by an etching agent.

Figure 4:
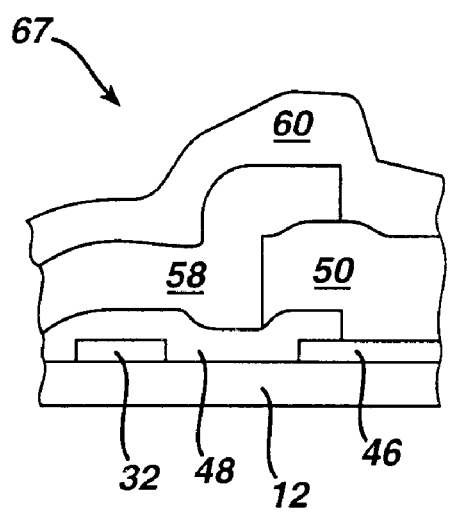
FIGS. 4–7 are cross-sectional views of part of the array segment portion of FIG. 3 during fabrication.

FIG. 4 depicts a relevant portion 67 above data line 32 of section 42 of FIG. 3 during the later steps of fabrication. It will be understood that the fabrication process over data line 34 is similar. At this stage, as part of the process of forming the striped segments of the common electrode, organic dielectric layer 60 is deposited, and patterned to remove it over the data lines, except where the data lines intersect with the bridge members 40. Organic dielectric layer 60 has a thickness of about 0.5 microns to about 2.5 microns. One example of an organic dielectric material that could be used for layer 60 is polyimide, preferably preimidized.

Figure 5:
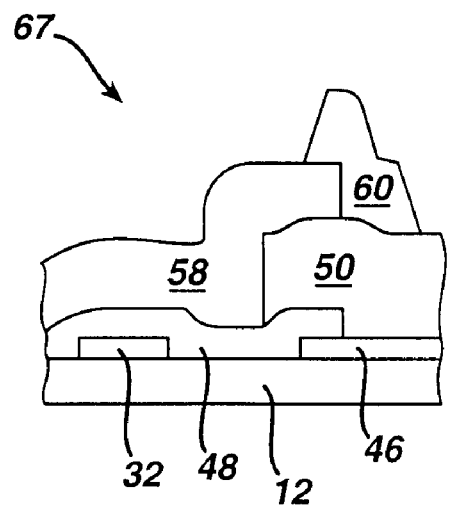

FIG. 5 depicts portion 67 after patterning of organic dielectric layer 60. Conventional lithographic techniques (e.g. photoresist) commonly are used to do the patterning.

Figure 6:
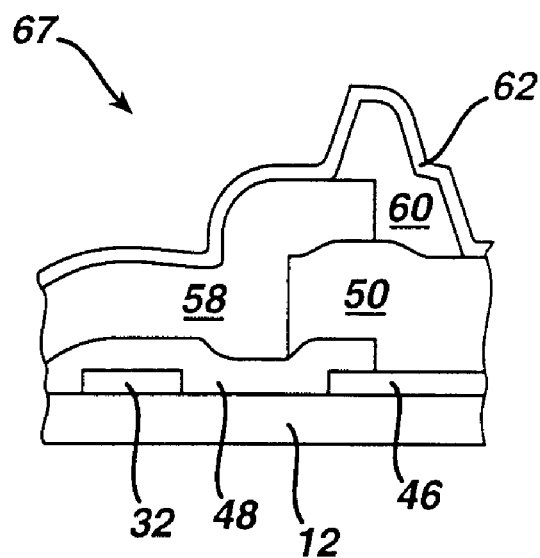

FIG. 6 depicts portion 67 after deposition of light-transmissive conductive layer 62, and before patterning of same. Light-transmissive conductive layer 62 has a thickness of about 500 Å to about 2000 Å, and comprises indium tin oxide or the like.

Figure 7:
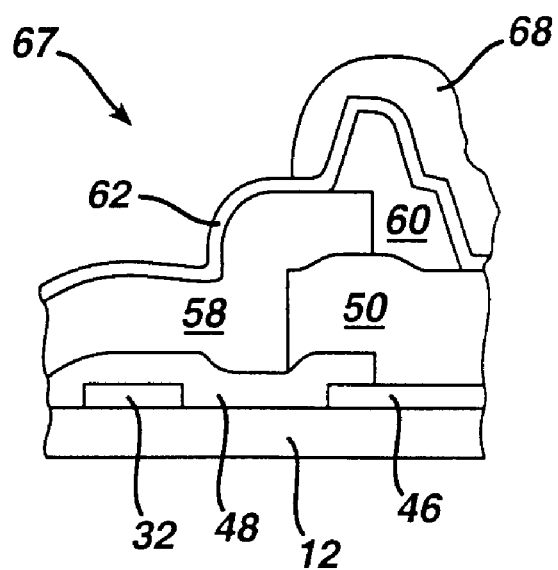

FIG. 7 depicts portion 67 from FIG. 6 after a layer of photoresist 68 is deposited, exposed, and developed for patterning of light-transmissive conductive layer 62. Once the section of layer 62 not covered by photoresist 68 is removed, the remaining photoresist must also be removed.

For example, where the light-transmissive conductive layer 62 is indium tin oxide, patterning would typically be accomplished using HCl containing etchants (i.e., a "wet" etch). However, it will be understood that other wet etches (or dry etches, such as, for example, reactive ion etching) can be used. Each photoresist removal method has its unique characteristics.

The wet stripping is generally more expensive and has been noted to harm the vias for the contact pads for connection to off-array components, also described below with regards to FIG. 10, while ashing will attack polyimide layer 60 and has a tendency to undercut it. Such undercutting could lead to step coverage degradation for subsequent depositions, such as, for example, a barrier layer for a an x-ray imager such that the functionality of the barrier layer to protect the photodiodes from moisture would be degraded. The present invention allows the use of ashing without leaving the organic dielectric layer exposed in an undercut condition.

As one skilled in the art will know, ashing is essentially a "gentle" plasma etching process. One form of etches uses reactive ion etching (RIE). Briefly, the workpiece is placed in a chamber at higher pressure than conventional RIE with an $O_2$ plasma. An RF potential creates a plasma which causes the photoresist to be etched. The higher pressure changes the mean free path of the ions produced, reducing ion bombardment, and in this sense is more gentle. Though not accurate, ashing is often thought of more as burning the material away with an enhanced oxidation process using oxygen ions.

Figure 8:
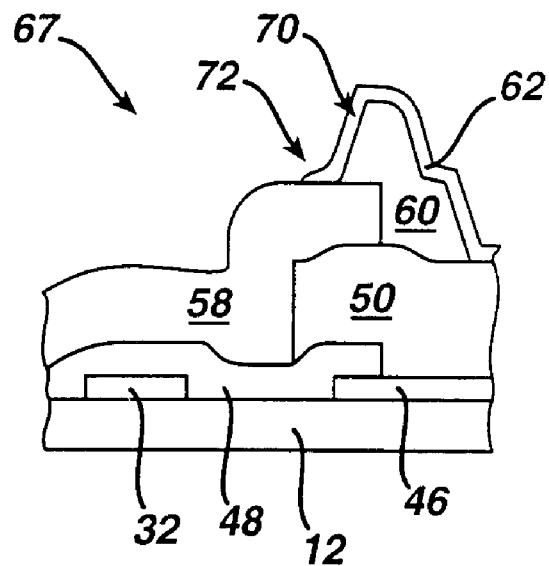
FIG. 8 is a cross-sectional view taken along lines 8—8 of FIG. 2 of a bridge member.

FIG. 8 depicts portion 67 after patterning of light-transmissive conductive layer 62, and removal of photoresist 68. As shown in FIG. 8, edge 70 of organic dielectric layer 60 is sealed with an extension 72 of light-transmissive conductive layer 62. Extension 72 extends about 1 to about 5 microns beyond edge 70. The end result is that depicted in FIG. 3.

Figure 9:
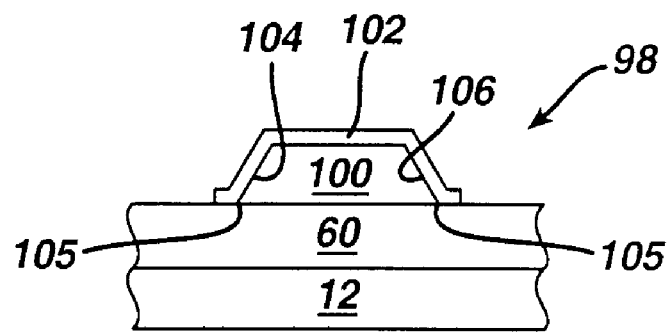
FIG. 9 is a close-up view of a portion of the imager of FIG. 1.

FIG. 9 is a cross-sectional view of a portion 98 of bridge member 40 taken along lines 9—9 of FIG. 2. As shown, each bridge member includes a layer 100 of the organic dielectric material of layer 60 of FIG. 3, and a layer 102 of the light-transmissive conductive material of the common electrode. The conductive material covers the edges 104 and 106 of the dielectric material, and extends about 1 to about 5 microns beyond edge 104, 106 (that is, beyond the termination region 105 of layer 100) to provide protection for layer 100.

Figure 10:
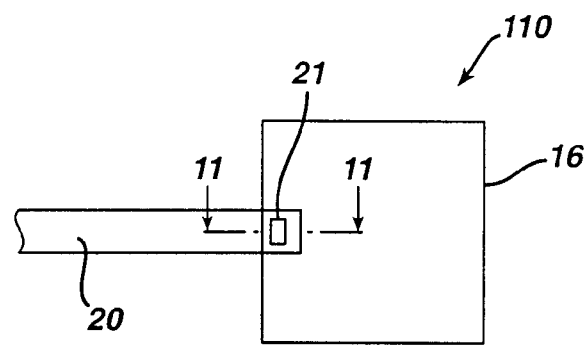
FIG. 10 is a cross-sectional view taken along lines 10—10 of the imager portion of FIG. 9.

FIG. 10 depicts a portion 110 of imager 10 from FIG. 1. Portion 110 shows details of the connection between contact pad 16 and finger 20. Finger 20 actually runs underneath contact pad 16 and electrically couples thereto at contact via 21. Contact via 21 typically comprise, for example, a light-transmissive conductive layer (e.g., ITO). Contact pad 16 preferably comprises the same material as the common electrode (preferably, indium tin oxide).

Figure 11:
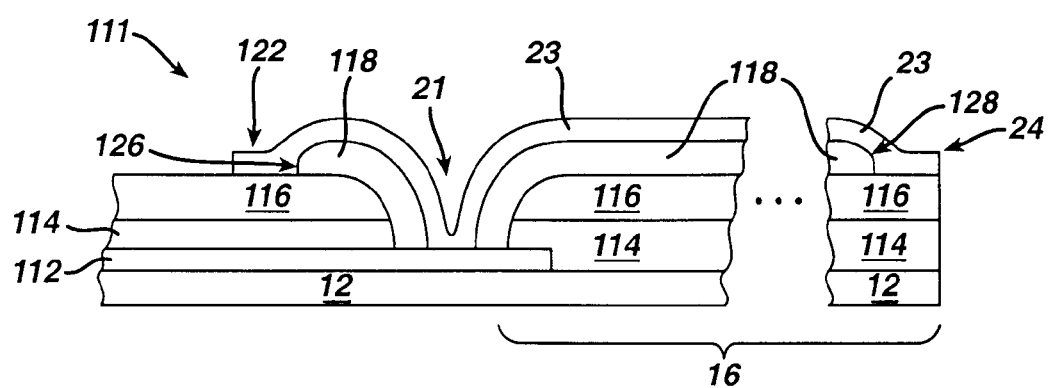
FIG. 11 is a cross-sectional view of part 111 of portion 110 taken along lines 11—11 in FIG. 10.

FIG. 11 is a cross-sectional view of part 111 of portion 110 taken along lines 11—11 in FIG. 10. As shown in FIG. 11, finger 20 over substrate 12 comprises a conductive layer 112

(e.g., molybdenum, aluminum, or a combination of tiers of each material) similar to the data lines in composition. Over the conductive layer is a dual passivation dielectric comprising layers 114 and 116. Like layer 48 in FIG. 3, layer 114 comprises, for example, silicon oxide. Similarly, like layer 58 in FIG. 3, layer 116 comprises, for example, silicon nitride or alternatively silicon oxide, or combination thereof. Over the passivation dielectrics is a layer 118 of an organic dielectric (e.g., polyimide). Layer 118 is preferably formed at the same time in the fabrication process as layer 60 (FIG. 3), and may actually be the same physical layer. The light-transmissive conductive layer 23, filling contact via 21, permits electrical contact between conductive layer 112 of finger 20 and contact pad 16. As with FIG. 3, light-transmissive conductive layer 23 includes extensions 122 and 124 of at least about 1 to about 5 microns covering the edges 126 and 128, respectively, of organic dielectric layer 118 to prevent damage thereto. Moreover, layers 23 and 62 (FIG. 3) are preferably formed at the same time in the fabrication process, and may actually be the same physical layer.

The sealing of exposed polyimide boundaries as described herein along the striped segments of the common electrode can be expanded to any situation in which an organic dielectric layer may be in danger of undercutting.

In another example of the present invention, a method of fabricating a structure for an imager is presented. An organic dielectric layer is formed, and covered by a light-transmissive conductive layer. The light-transmissive conductive layer is extended beyond an exposed edge of the organic dielectric layer sufficient to protect the exposed edge in subsequent fabrication of the imager.

In still another example of the present invention, a method of fabricating an imager is presented. A layer of light-transmissive conductive material is formed directly over an organic dielectric layer to act as an electrical contact within the imager. The layer of light-transmissive conductive material is extended at least about one micron beyond an exposed edge of the organic dielectric layer.

Although the present invention has been described with reference to the particular embodiments herein, it will be understood that the technique of sealing the edges of the polyimide or other dielectric with light-transmissive conductive oxide or other conductive material is applicable in other situations. Thus, alternative aspects may be effected by those skilled in the art.

What is claimed is:

1. A method of fabricating a structure for an x-ray imager, comprising:

forming an imager array having a pattern pixels comprising light-sensitive imaging elements with a respective switching device, the pixels being coupled together via rows and columns of conductive lines;

forming an organic dielectric layer over portions of the light-sensitive elements and said rows and columns of conductive lines, said organic dielectric layer having sidewall edges where said organic dielectric layer is patterned to not extend over said array; and forming a light-transmissive conductive layer disposed to couple said light-sensitive imaging elements together, said conductive layer being patterned into striped segments with connecting bridges so as to contact each light-sensitive element, and further disposed to cover the sidewall edges of said organic dielectric layer;

the light-transmissive conductive layer being disposed beyond an exposed edge of the organic dielectric layer sufficient to protect the sidewall edges of said organic dielectric layer in subsequent fabrication of the imager.

2. The method of claim 1 wherein forming the organic dielectric layer comprises forming a polyimide layer.

3. The method of claim 2, wherein forming the polyimide layer comprises forming a preimidized polyimide layer.

4. The method of claim 1, wherein forming the light-transmissive conductive layer comprises forming a light-transmissive conductive oxide layer.

5. The method of claim 4, wherein forming the light-transmissive conductive oxide layer comprises forming a layer of indium tin oxide.

6. The method of claim 1 wherein the extending comprises extending the light-transmissive conductive layer at least about one micron beyond the exposed edge.

7. The method of claim 6 wherein the extending comprises extending the light-transmissive conductive layer between about one micron and about five microns beyond the exposed edge.

8. A method of fabricating an imager, comprising:

forming an imager array having a pattern pixels comprising light-sensitive imaging elements with a respective switching device, the pixels being coupled together via rows and columns of conductive lines;

forming a layer of light-transmissive conductive material directly over an organic dielectric layer to act as a common electrode within the imager, said common electrode being patterned into striped segments with connecting bridges so as to contact each light-sensitive element; and disposing the layer of light-transmissive conductive material at least about one micron beyond an exposed edge of the organic dielectric layer along patterned segments of said common electrode fanned by said layer of light-transmissive conductive material.

9. The method of claim 8, wherein the extending comprises extending the layer of light-transmissive conductive material between about one micron and about five microns beyond the exposed edge.

10. The method of claim 8 wherein said connecting bridges are disposed such that about 10 to about 20 of the plurality of light-sensitive imaging elements separate bridge members in the row or column.

11. The method of claim 8 wherein the method further comprises electrically coupling the array to circuitry outside the array, and wherein the electrically coupling comprises forming the layer of light-transmissive conductive material and extending the layer of light-transmissive conductive material.

* * * * *

UNITED STATES PATENT AND TRADEMARK OFFICE
CERTIFICATE OF CORRECTION

PATENT NO. : 6,680,216 B2  Page 1 of 1
DATED : January 20, 2004
INVENTOR(S) : Robert Forrest Kwasnick and Jianqiang Liu It is certified that error appears in the above-identified patent and that said Letters Patent is hereby corrected as shown below:

Column 1,
Line 7, should read -- The United States Government may have certain rights in this invention pursuant to contract number MDA972-94-3-0028 awarded by the Advanced Research Project Agency (ARPA). --

Signed and Sealed this

Fifteenth Day of June, 2004

JON W. DUDAS
*Acting Director of the United States Patent and Trademark Office*